United States Patent
Tao et al.

(10) Patent No.: US 6,733,904 B2
(45) Date of Patent: May 11, 2004

(54) USE OF OLIGO(PHENYLENEVINYLENE)S IN ORGANIC LIGHT-EMITTING DEVICES

(75) Inventors: Ye Tao, Ottawa (CA); Marie D'Iorio, Gloucester (CA); Man Shing Wong, Shatin (HK)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/906,145

(22) Filed: Jul. 17, 2001

(65) Prior Publication Data

US 2002/0028348 A1 Mar. 7, 2002

Related U.S. Application Data

(60) Provisional application No. 60/218,530, filed on Jul. 17, 2000.

(51) Int. Cl.$^7$ ................................................ H05B 33/12

(52) U.S. Cl. ........................ 428/690; 428/917; 313/504; 313/506; 427/66

(58) Field of Search ................................ 428/690, 917; 313/504, 506; 427/66

(56) References Cited

U.S. PATENT DOCUMENTS

| | | | | |
|---|---|---|---|---|
| 5,121,029 A | * | 6/1992 | Hosokawa et al. | 313/504 |
| 5,247,190 A | | 9/1993 | Friend et al. | 257/40 |
| 5,281,489 A | * | 1/1994 | Mori et al. | 428/690 |
| 5,294,870 A | | 3/1994 | Tang et al. | 313/504 |
| 5,414,069 A | | 5/1995 | Cumming et al. | 528/310 |
| 5,536,949 A | * | 7/1996 | Hosokawa et al. | 257/40 |
| 5,759,444 A | | 6/1998 | Enokida et al. | 252/301.16 |
| 5,994,836 A | | 11/1999 | Boer et al. | 313/504 |
| 6,023,073 A | | 2/2000 | Strite | 257/40 |
| 6,046,543 A | | 4/2000 | Bulovic et al. | 313/504 |
| 6,125,226 A | | 9/2000 | Forrest et al. | 385/131 |
| 6,150,043 A | | 11/2000 | Thompson et al. | 428/690 |

FOREIGN PATENT DOCUMENTS

| | | |
|---|---|---|
| WO | 90/13148 | 11/1990 |
| WO | 92/03491 | 3/1992 |

OTHER PUBLICATIONS

"Design of organic molecules with large two–photon absorption cross sections", M. Albota et al., Science, vol. 281, 1653–1656 (Sep. 1998).
"Light–emitting diodes based on conjugated polymers", J.H. Burroughes et al., Nature, vol. 347, 539–541 (Oct. 1990).
"Electroluminescence in conjugated polymers", R.H. Friend et al., Nature, vol. 397, 121–127 (Jan. 1999).
"The electroluminescence of organic materials", U. Mitschke et al., J. Mater. Chem.—10, 1471–1507 (Jun. 2000).
"Electroluminescent behaviour of a homologous series of phenylenevinylene oligomers", V. Gebhardt et al., Advanced Materials, 11, No. 2, 119–123 (1999), (no month).

"Towards highly luminescent phenylene vinylene films", Dieter Oelkrug et al., Synthetic Metals, 83, 231–237 (1996), (no month).
"Conjugated dendrimers for light–emitting diodes: effect of generation", Advanced Materials, 11, No. 5, 371–374 (1999), (no month).
"Light–emitting diodes based on phenylenevinylene oligomers with defined chain lengths", V. Gebhardt et al., Synthetic Metals, 90, 123–126 (1997), (no month).
Optical properties of single crystals and vacuum–deposited thin films of a substituted oligo(p–phenylene vinylene), H.J. Brouwer et al., Chemical Physics, 227, 65–74 (1998), (no month).
"Model compounds for light–emitting PPV's: optical and structural data of substituted oligomers", R. Gill et al., Synthetic Metals, 84, 637–638 (1997), (no month).
"Oligo–2,6–naphthylenevinylenes—new building blocks for the preparation of photoluminesent polymeric materials", Jose L. Segura et al., Eur. J. Org. Chem., 643–651 (1999), (no month).
"Synthesis and structural studies of poly(p–phenylenevinylene) analogous model compounds", M. Hohloch et al., Chemical Materials, 10, 1327–1332 (1998), (no month).
"A model oligomer approach to light–emitting semiconducting polymers", P. F. Van Hutten, et al., Accounts of Chemical Research, vol. 32, No. 3, 257–265 (1999), (no month).
"Alkoxylated p–phenylenevinylene oligomers: synthesis and spectroscopic and electrochemical properties", H. Ndayikengurukiye et al., Tetrahedron, vol. 53, No. 40, 13811–13828 (1997), (no month).
"Electrical characterization of phenylene–vinylene oligomer based diodes", T.P. Nguyen et al., Synthetic Metals, 85, 1357–1358 (1997), (no month).
"Oligophenylenevinylenes for light–emitting diodes", T. Goodson III et al., Advanced Materials, 9, No. 8, 639–642 (1997), (no month).
"Two novel thermotropic liquid crystalline substituted oligo(p–phenylene–vinylene)s: single crystal x–ray determination of an all–trans oligomeric PPV", R. E. Gill et al., Advanced Materials, 8, No. 3, 212–214 (1996), (no month).
Organic light emitting diodes based on end–substituted oligo(phenylenevinylene)s, Y. Tao et al, Thin Solid Films, 363, 298–301 (2000), (no month).
"Luminescence properties of end–substituted oligo(phenylenevinylene)s", Ye Tao et al., Synthetic Metals, 111–112, 417–420 (2000), (no month).

(List continued on next page.)

Primary Examiner—Marie R. Yamnitzky
(74) Attorney, Agent, or Firm—Lawrence E. Laubscher, Jr.

(57) ABSTRACT

An organic light-emitting device comprising an anode, a cathode, and an emissive layer between the anode and cathode, wherein either the emissive layer is an oligo (phenylenevinylene) or derivative thereof is described. The device may further include a hole transport layer and/or an electron transport layer coupled with either the anode or cathode. Also described are displays employing such devices and a method of making such a device.

26 Claims, 9 Drawing Sheets

OTHER PUBLICATIONS

"Luminescent and electronic properites of end–substituted distyrylbenzene derivatives", Ye Yao, et al., Nonlinear Optics, vol. 25, 491–496 (2000), (no month).

"Spacial distribution of electroliminescence from oriented phenylenevinylene oligomer—Langmuir–Blodgett film," Masano Era et al, Synthetic Metals 91 (1997) 83–85, (no month).

Abtract: Investigation of the Electroluminescent Properties of End–Substituted Oligophenylene Vinylenes Ye Tao et al. 2nd Int'l Conference on Electroluminescence from Molecular material, (May 13–15, 1999)Shieffield, U.K..

Abstract: Optical and Electrical Properties of OPV–Based Organic Light Emitting Devices—M.S. Wong, et al. Asia—Pacific Symposium on organic electroluminescent material and devices, Jun. 8–11, 1999, Hong Kong.

Synthesis and Properties of Highly Soluble Third–Order Optically Nonlinear Chromophores and Methacrylate Nomomer Based on Distyrylebenzene—M.S. Wong, et al. J. Mater, Chem. 1998, 8 (9), 2005–2009, (no month).

\* cited by examiner

MP-OPV(1)-NBu

DSi-OPV(1)-NBu

MSi-OPV(1)-NBu

G[0]-OPV(1)-NR

G[0]-OPV(1)-NR(m)

USE OF OLIGO(PHENYLENEVINYLENE)S IN ORGANIC LIGHT-EMITTING DEVICES

This application claims the benefit of U.S. Provisional Application No. 60/218,530 filed Jul. 17, 2000, incorporated by reference herein.

FIELD OF THE INVENTION

The present invention relates to multicolor organic light-emitting materials and devices constructed using such materials. More specifically, the present invention relates to the use of oligo(phenylenevinylene)s in organic light-emitting devices (OLED).

BACKGROUND OF THE INVENTION

Electronic displays are utilized in television sets, computer terminals and in a host of other applications. Such a medium offers speed, versatility, and interactivity. Manufacturers of electronic devices are working to develop displays that provide brighter, sharper pictures and provide a high resolution full color display at good light level and at competitive pricing.

The drive to improved displays has lead to the development of liquid crystal displays (LCDs). LCDs operate fairly reliably. However, LCD technology has a number of shortcomings, including weak brightness, relatively low contrast and resolution, large power requirements and high power backlighting requirements.

One alternative to LCDs are light-emitting displays (LEDs). Light-emitting displays make use of thin film materials which emit light when excited by electric current. Light-emitting displays are often fabricated using inorganic materials, such as manganese (Mn)-doped zinc sulfide (ZnS). Although inorganic light-emitting displays can provide high performance and durability, they suffer from large power requirements and expensive manufacturing.

Organic light-emitting displays (OLEDS), on the other hand, can be realized in a flexible form. Their electroluminescent wavelength can be selected from a wider range than inorganic displays. Furthermore, organic electroluminescent devices can easily be fabricated by means of a coating technique and large devices of this type can be easily produced at low cost. Another advantage is that a low voltage can drive organic electroluminescent devices.

OLEDs, whose structure is based upon the use of layers of organic optoelectronic materials, generally use radiative recombination of excitons as a mechanism to produce optical emission. OLEDs are typically comprised of at least two thin organic layers between an anode and a cathode, as shown in FIG. 1. The material of one of these layers is specifically chosen based on the material's ability to transport holes, a "hole transporting layer" (HTL) 13, and the material of the other layer is specifically selected according to its ability to transport electrons, an "electron transporting layer" (ETL) 17. The electroluminescent material may be present in a separate emissive layer (EML) 15 between the HTL and the ETL in what is referred to as a "double heterostructure" (DH). With the application of an electric potential (typically 100 MV/m), the anode 11 injects holes (positive charge carriers) into the HTL 13, while the cathode 19 injects electrons into the ETL 17. The injected holes and electrons each migrate toward the oppositely charged electrode. When an electron and hole localize in the EML 15 on the same molecule, a Frenkel exciton is formed. These excitons are trapped in the material which has the lowest energy. Recombination of the short-lived excitons may be visualized as an electron dropping from its conduction potential to a valence band, with relaxation occurring, under certain conditions, preferentially via a photoemissive mechanism.

Alternatively, the materials that function as the ETL or HTL of an OLED may also serve as the medium in which exciton formation and electroluminescent emission occur. Such OLEDs are referred to as having a "single heterostructure" (SH).

Various compounds have been used as HTL materials or ETL materials. HTL materials often consist of triaryl amines in various forms which show high hole mobilities (approximately $10^{-3}$ cm$^2$/Vs). The most common hole transporter used in the HTL of OLEDs is a biphenyl bridged diamine, N,N'-diphenyl-N,N'-bis(3-methylphenyl)-1,1-biphenyl-4,4'-diamine (TPD). Aluminum tris-(8-hydroxyquinolate) (Alq$_3$) is the most common ETL material, and others include oxidiazole, triazole, and triazine.

Various compounds have been employed as electroluminescent emitters. Such compounds may be present in the EML, separate from the ETL and HTL layers. Alternatively, such compounds may be combined into or be the same as the compounds used in the ETL or HTL layers.

Burroughes et al., Nature, Vol. 347, 1990, pp. 539 describe the use of a highly fluorescent conjugated polymer, poly (phenylenevinylene) (PPV), as the active material in a single-layer OLED, in which a thin layer of the active organic material is sandwiched between two electrode. The use of PPV in electroluminescent devices is also described in U.S. Pat. No. 5,247,190 (issued Sep. 21, 1993). Both references are incorporated herein by reference. Some difficulties associated with PPV include the use of wet processes such as spin-coating, difficulties in fabricating multilayer devices for confined structures, and emission peaks in the green, or green-yellow regions of the spectrum, rather than in the blue.

Initially synthesized as model compounds in order to gain more insight into the structural and electronic peculiarities of the corresponding polymers, conjugated oligomers have also been investigated as potential materials in electrooptical applications. The use of oligo(phenylenevinylene)s (OPV), oligo(phenylene)s, and oligothiophenes, for example, has been investigated (see a review article on OLEDs by Mitschke et al. *J. Mater. Chem.* 2000, Vol. 10, 1471–1507, incorporated by reference herein).

The shorter conjugated segment of OPVs compared with PPVs improves the fluorescence yields and the electroluminescent efficiency, and the wavelength for absorption and emission decreases with decreasing conjugated length.

However, there still exists a need for efficient and stable materials, especially blue emitters, such as in the 420–450 nm range.

SUMMARY OF THE INVENTION

The use of oligo(phenylenevinylene) (OPV) and its derivatives in light-emitting devices (LEDs) is disclosed. Also disclosed are light-emitting devices made from oligo (phenylenevinylene)s, as well as displays employing such devices.

Thus, according to one aspect, the invention provides a light-emitting device comprising an anode; a cathode; and an emissive layer between the anode and cathode, comprising an oligo(phenylenevinylene) of the Formula (I):

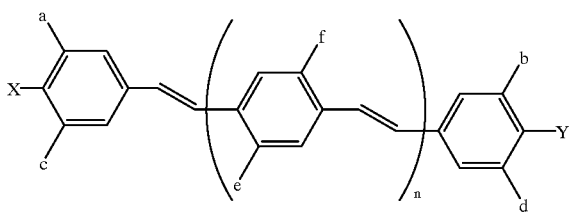

wherein
  n is 0 to 8;
  X is H, NHR, NR$_2$, (O(CH$_2$)$_2$)$_2$OR, OR, NO$_2$, or SO$_2$R;
  Y is H, NHR, NR$_2$, (O(CH$_2$)$_2$)$_2$OR, OR, NO$_2$, or SO$_2$R;
  a, b, c, and d are each independently selected from the group consisting of H, R, OR, NHR, and NR$_2$;
  e and f are each independently selected from the group consisting of H, SiR$_3$, alkyl, and aryl groups; and
  each R is independently selected from the group consisting of a substituted and unsubstituted alkyl and aryl groups; and
wherein if both X and Y are OR, at least one of a, b, c, d, e, and f is other than H; if both X and Y are one of (O(CH$_2$)$_2$)$_2$OCH$_3$ and SO$_2$C$_6$H$_{13}$, at least one of a, b, c, d, e, and f is other than H; if X, Y, e, and f are all H, at least one of a, b, c, and d is other than H, and a, b, c, and d are not all tert-butyl; and if X, Y, a, b, c, and d are all H, e and f are not both C$_6$H$_{13}$ or both C$_8$H$_{17}$.

Also disclosed is a display employing the device.

In another aspect, the invention provides a method of making a light-emitting device, the method comprising the steps of preparing an oligo(phenylenevinylene) of the Formula (I); and layering the oligo(phenylenevinylene) of the Formula (I) between an anode and a cathode to form a light-emitting diode.

In a further aspect, a method of the invention further comprises the step of selecting n, X, Y, a, b, c, d, e, f, and R of the OPV of Formula (I) to selectively tune the emissive wavelength of the OPV to a desired wavelength In another aspect, the invention provides the use of an oligo(phenylenevinylene) according to Formula (I) for electroluminescent emission in a light-emitting device.

There are many advantages in using low molecular weight OPVs of the invention for light-emitting devices. First, OPVs can be sublimated in vacuum, which eliminates the use of organic solvents and makes multilayer structures possible. Secondly, the emission peak of OPVs can be shifted to the blue or green-blue regions of the spectrum by reducing the length of the π-conjugated backbone. Thirdly, OPVs have well-defined chain lengths and molecular structure, that makes data analysis easier than on polymer system, and provides a better basis for understanding the relationship between the molecular structures and the chemical/physical properties.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein.

This invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE PREFERRED EMBODIMENTS

Figure 1:
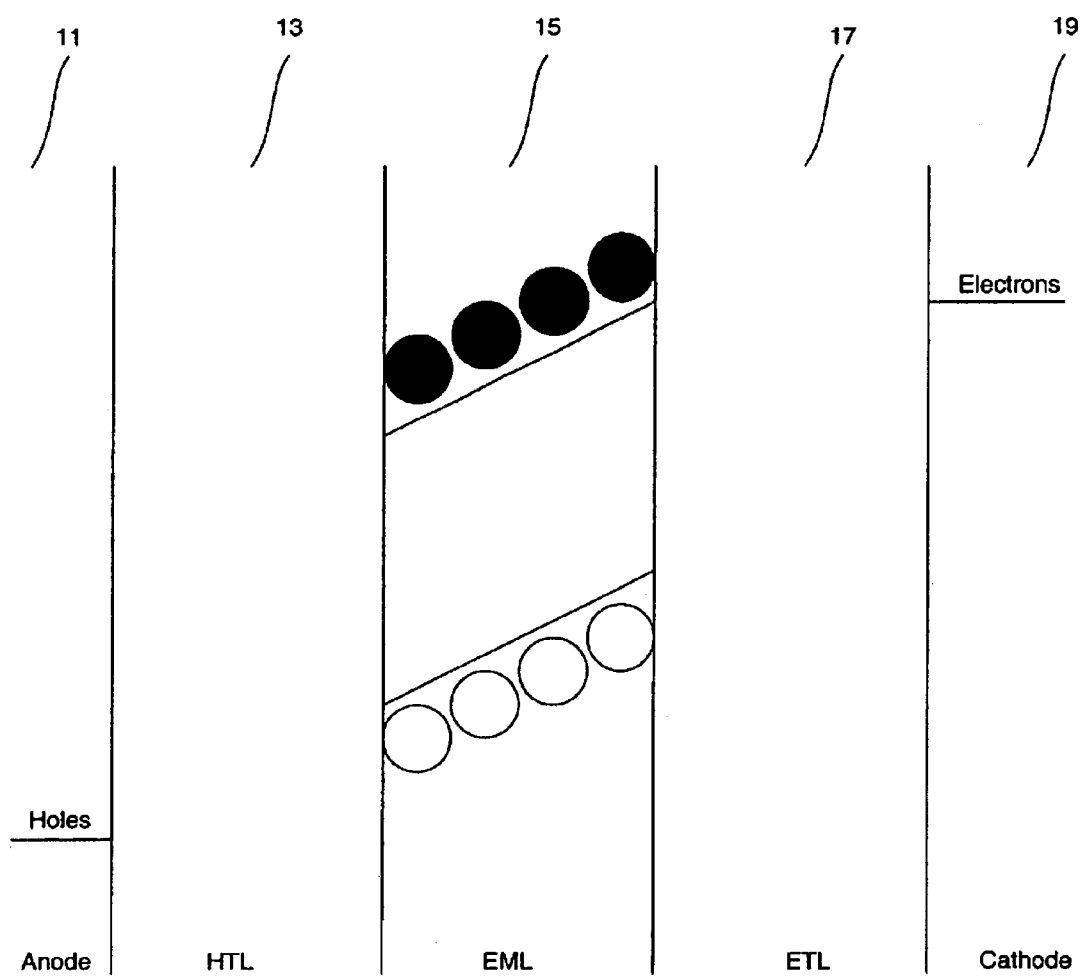
FIG. 1 illustrates a schematic representation of a double heterostructure organic light-emitting device (DH-OLED)
Figure 2A:
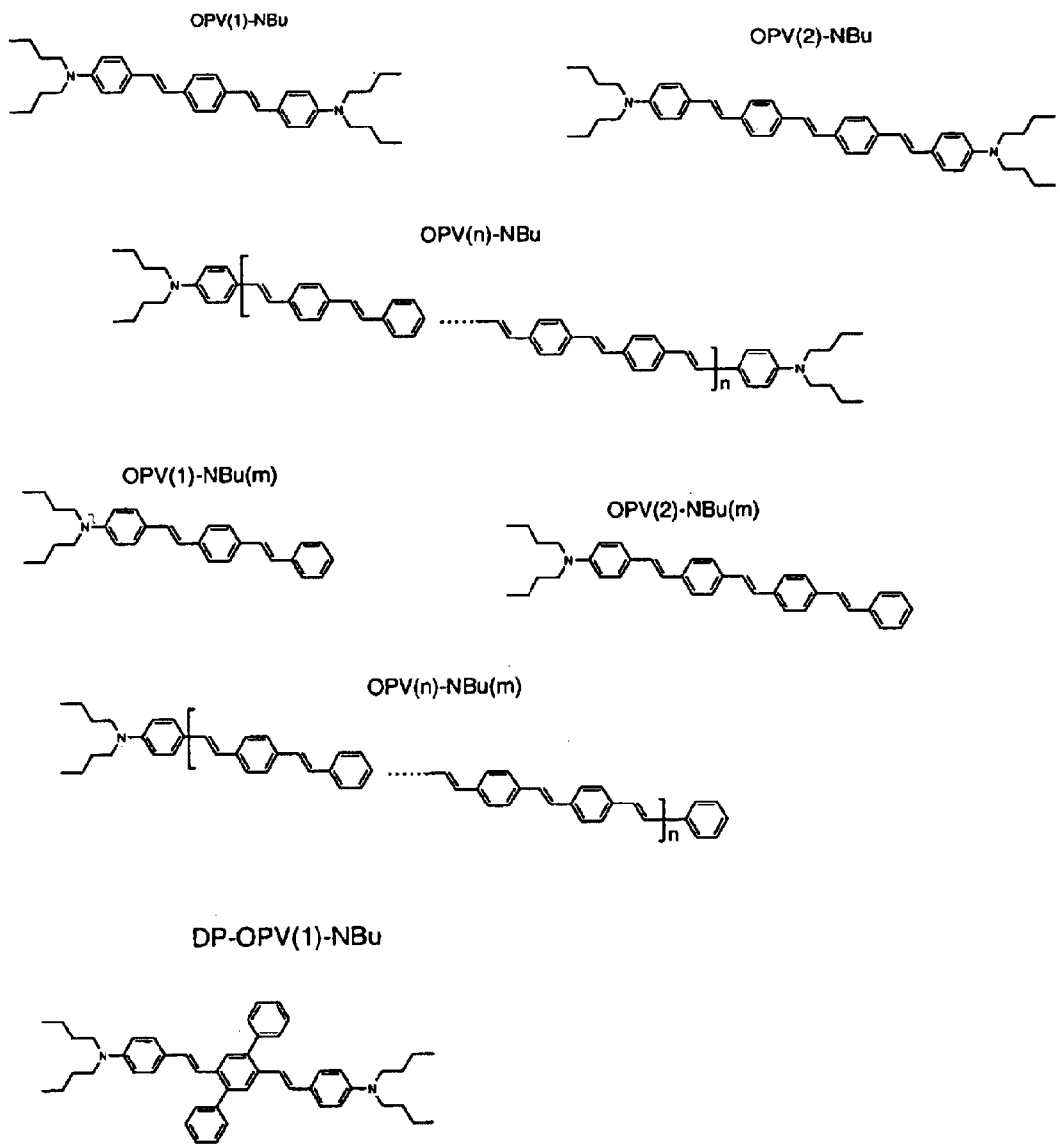
FIGS. 2A, 2B, and 2C illustrate examples of light-emitting materials in accordance with an aspect of the invention.
Figure 2B:
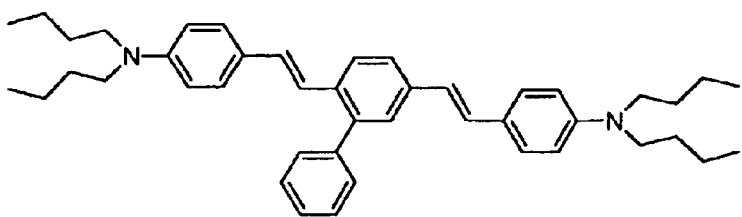
Figure 2B:
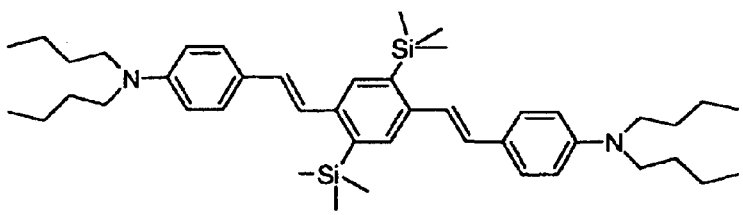
Figure 2B:
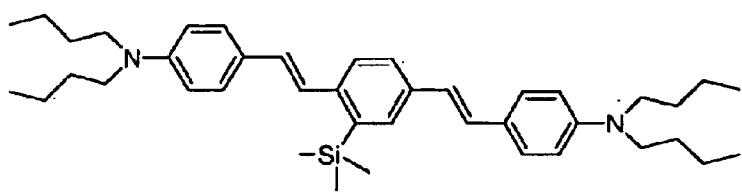
Figure 2B:
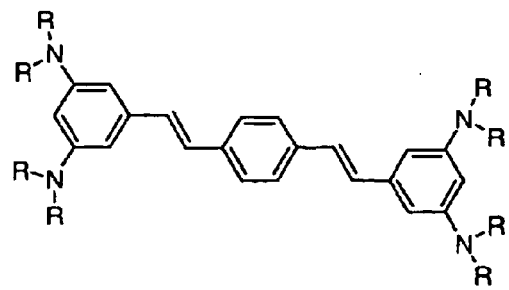
Figure 2B:
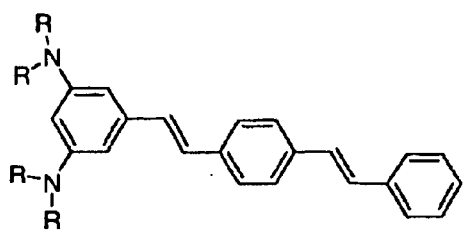
Figure 2C:
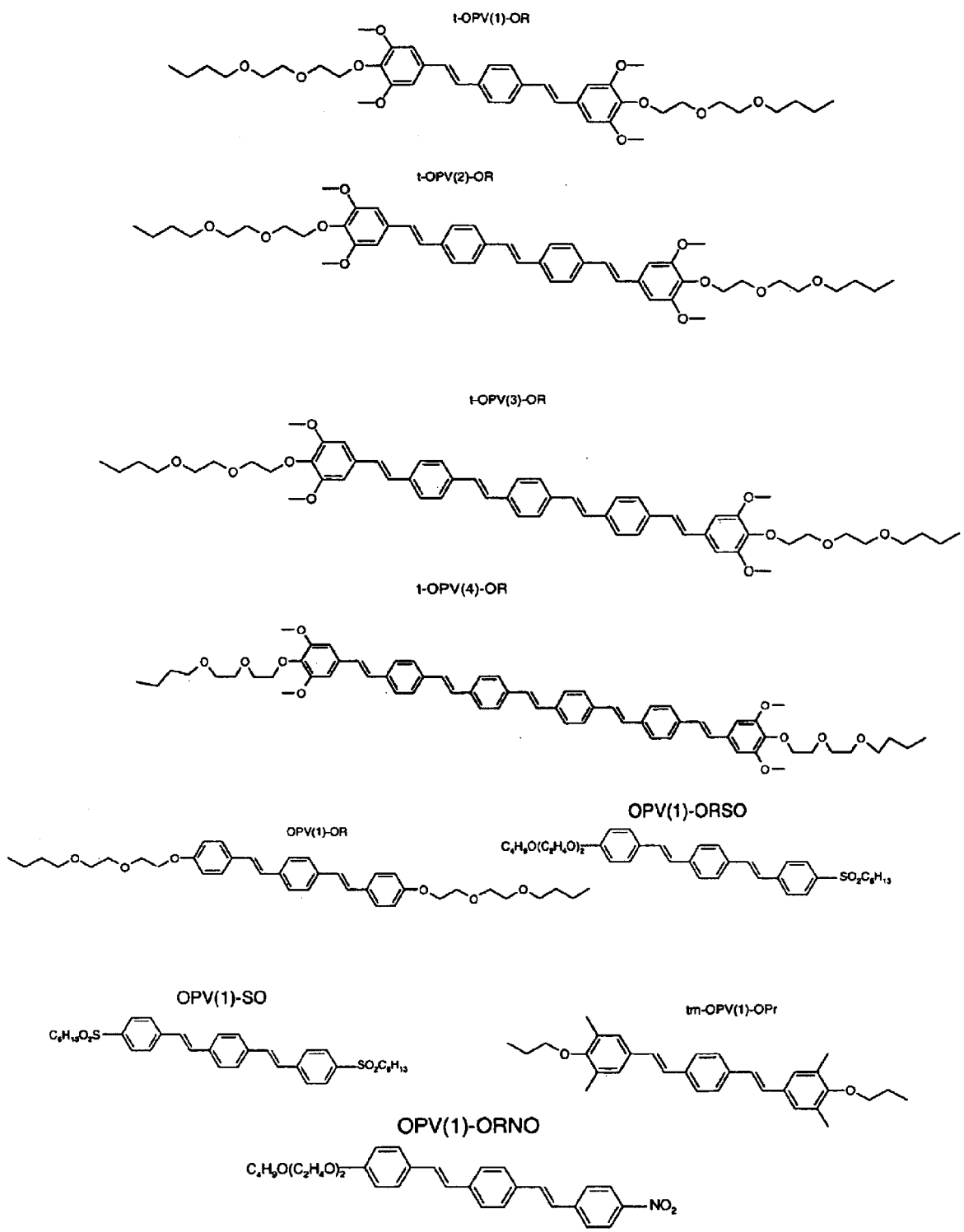

Referring to FIGS. 2a, 2b and 2c, some oligo(phenylenevinylene)s (OPVs) for use in accordance with one aspect of the invention are illustrated, and are examples of OPVs of the invention. The OPVs of the invention are represented by the Formula (I):

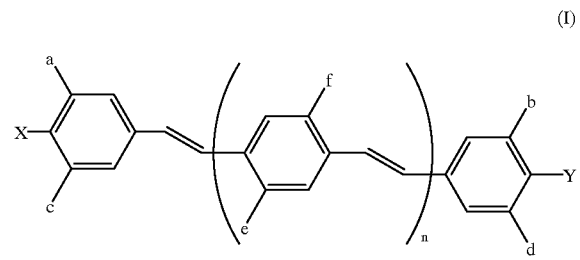

wherein
  n is 0 to 8;
  X is H, NHR, NR$_2$, (O(CH$_2$)$_2$)$_2$OR, OR, NO$_2$, or SO$_2$R;
  Y is H, NHR, NR$_2$, (O(CH$_2$)$_2$)$_2$OR, OR, NO$_2$, or SO$_2$R;
  a, b, c, and d are each independently selected from the group consisting of H, R, OR, NHR, and NR$_2$;
  e and f are each independently selected from the group consisting of H, SiR$_3$, alkyl, and aryl groups; and
  each R is independently selected from the group consisting of a substituted and unsubstituted alkyl and aryl groups; and
wherein if both X and Y are OR, at least one of a, b, c, d, e, and f is other than H; if both X and Y are one of (O(CH$_2$)$_2$)$_2$OCH$_3$ and SO$_2$C$_6$H$_{13}$, at least one of a, b, c, d, e, and f is other than H; if X, Y, e, and f are all H, at least one of a, b, c, and d is other than H, and a, b, c, and d are not all tert-butyl; and if X, Y, a, b, c, and d are all H, e and f are not both C$_6$H$_{13}$ or both C$_8$H$_{17}$.

The oligo(phenylenevinylene) (OPV) of Formula (I) may be selected such that:
  n is 1 to 4;
  X is H, NHR, NR$_2$, (O(CH$_2$)$_2$)$_2$OCH$_3$, OC$_3$H$_7$, OC$_4$H$_9$, OC$_5$H$_{11}$, OC$_6$H$_{13}$, NO$_2$, or SO$_2$C$_6$H$_{13}$;

Y is H, NHR, NR$_2$, (O(CH$_2$)$_2$)$_2$OCH$_3$, OC$_3$H$_7$, OC$_4$H$_9$, OC$_5$H$_{11}$, OC$_6$H$_{13}$, NO$_2$, or SO$_2$C$_6$H$_{13}$;

a, b, c, and d are each independently selected from the group consisting of H, CH$_3$, OCH$_3$, NH(C$_{3-8}$-alkyl), and N(C$_{3-8}$-alkyl)$_2$;

e and f are each independently selected from the group consisting of H, Si(C$_{3-8}$-alkyl)$_3$, and C$_{6-14}$-aryl groups; and each R is independently selected from the group consisting of C$_{3-8}$-alkyl and C$_{6-14}$-aryl groups;

wherein if both X and Y are OR, at least one of a, b, c, d, e, and f is other than H; if both X and Y are one of (O(CH$_2$)$_2$)$_2$OCH$_3$ and SO$_2$C$_6$H$_{13}$, at least one of a, b, c, d, e, and f is other than H; if X, Y, e, and f are all H, at least one of a, b, c, and d is other than H, and a, b, c, and d are not all tert-butyl; and if X, Y, a, b, c, and d are all H, e and f are not both C$_6$H$_{13}$ or both C$_8$H$_{17}$.

Examples of R groups include substituted or unsubstituted methyl, propyl, butyl, hexyl, phenyl, and methylphenyl groups.

In one aspect, both or one of the terminal ends of the OPV are dialkylamino, diarylamino, alkylamino, and/or arylamino groups with a chain length of 2 to 5 phenyl rings. Thus, the OPV of Formula (I) may be selected such that:

n is 0 to 3;

X is NHR or NR$_2$;

Y is H, NHR, or NR$_2$;

a, b, c, d, e, and f are each H; and each R is independently selected from the group consisting of C$_{3-8}$-alkyl and C$_{6-14}$-aryl groups.

Specifically mentioned as an example of an OPV is 1,4-bis-4-(dibutylamine)styrylbenzene (OPV(1)-NBu), illustrated in FIG. 2A. OPV(1)-NBu is a very efficient and bright green-blue emitter, with an efficiency of about 5 cd/A. This is because the oxidation potential of the OPV(1)-NBu is relatively low compared with other materials. Since it has a relatively low oxidation potential, it can also be used as hole injection or transport material in the HTL. The luminance of OPV(1)-NBu at 20 V is about 5000 cd/m$^2$.

Further examples are given in FIG. 2.

By changing the chain length and adding different functional groups as side- or end-group, the emission colour of the OPV can be tuned from yellow to blue. Selection of particular side- or end-groups based on their electronic property, such as by using strong electron donating or accepting groups, influences the emission colour. Furthermore, such a selection can be used to select OPVs which are particularly useful as hole injection/transporting or electron injection/transporting materials. For example, use of electron accepting groups in the OPV favours its electron injection/transporting capabilities, whereas use of strong electron donating groups favours its hole injection/transporting capabilities (see for example, Tao et al., Non-linear Optics (2000) Vol. 25, 491; Tao et al., Synthetic Metals 111–112 (2000) 417; and Tao et al., Thin Solid Films 363 (2000) 298, all of which are incorporated by reference herein).

The OPVs of the invention may be synthesized using techniques generally known in the art. Examples of synthetic routes using the stereoselective Wadsworth-Emmons reaction as a key step (see for example M. S. Wong, et al, J. Mater. Chem. 8 (1998) 2005, incorporated by reference herein).

Figure 3:
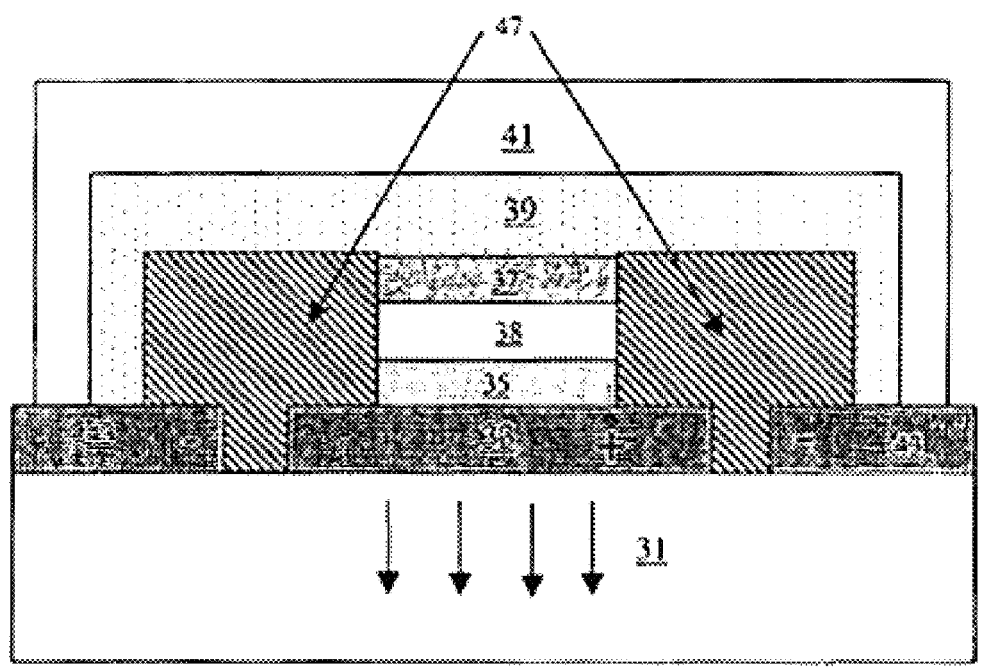
FIG. 3 illustrates an organic light-emitting device in accordance with one aspect of the invention.

Referring to FIG. 3, there is illustrated the structure of an organic light-emitting device in accordance with one aspect of the invention. A substrate layer of glass 31 is partially coated with a transparent conductive oxide, in this case indium-tin-oxide (ITO) to form the anode 33. On the ITO anode 33 is a layer of N,N'-diphenyl-N,N'-bis(3-methylphenyl)-1,1-biphenyl-4,4'-diamine (TPD) as hole transport layer (HTL) 35, followed by a layer of an OPV as emissive layer 38, and a layer of 2-(4-biphenylyl)-5-(4-tert-butylphenyl)-1,3,4-oxadiazole (PBD) as electron transporting layer (ETL) 37. The cathode is an aluminum cathode 39. The device may also include an ITO pad 43 to connect the cathode with the environment.

The substrate may be opaque or transparent, rigid, or flexible, and/or plastic, metal, or glass. The substrate may be as thin as 10 microns, if present as a flexible plastic or metal foil substrate, such as aluminum foil, or substantially thicker if present as a rigid, transparent or opaque, substrate, or if the substrate is comprised of a silicon-based display driver.

Materials that may be used as the hole transport anode layer, aside from ITO, include Zn—In—SnO$_2$, SbO$_2$, and other materials known in the art. The hole transport anode layer may be from about 50 nm to greater than 400 nm thick.

The HTL layer shown in FIG. 3 is 50 nm thick; however other thicknesses can be used, usually in the range of 5 or 10 to 100 nm. Other materials may be incorporated into or used instead of TPD as the hole transport layer. Examples of other hole transport layer materials include 4,4'-bis[N-(1-naphthyl)-N-phenylamino]biphenyl (NPB), OPVs, and molecules disclosed in the art (see for example U.S. Pat. No. 6,150,043 issued Nov. 21, 2000, and U.S. Pat. No. 6,023,073 issued Feb. 8, 2001, both of which are incorporated herein by reference). In one embodiment, the oligo (phenylenevinylene) of the Formula (I) may be used as the HTL.

The EML layer may have a variety of thicknesses, such as 5 to 100 nm. As shown in FIG. 3, the EML layer has a thickness of 50 nm. In some devices, the emissive layer may be purely made by OPV of Formula (I). More than one OPV may be used in the EML. Further, the OPVs may be mixed with other emitters such as anthracene, ATP, BNVP, coumarin, or other known emitters. In some devices, the emissive layer may be made by co-deposition of a hole transporting material, such as TPD or NPD, and OPV.

Figure 4:
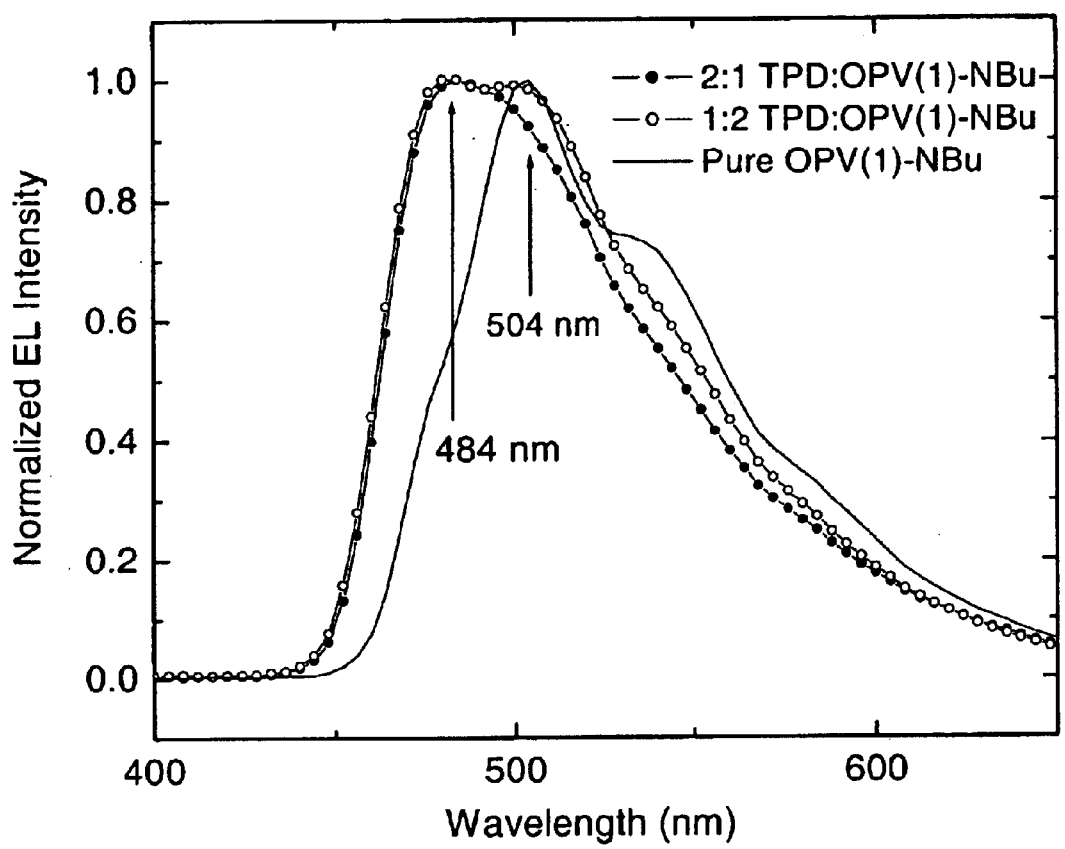
FIG. 4 illustrates the effect of co-deposition on emission color.

Co-deposition can achieve high quality thin films and may reduce red-shifts in emission color. In some cases, the EML may be TPD, NPD, or other hole transport layer material, doped with OPV. The effect of co-deposition on emission color in the case of OPV(1)-NBu is shown in FIG. 4. A comparison of 2:1 TPD:OPV(1)-NBu to 1:2 TPD:OPV(1)-NBu to pure OPV(1)-NBu, shows that the devices using co-deposited TPD:OPV(1)-NBu as emitter have shorter emission wavelengths.

In some devices of the invention, the OPV will not be present in the EML layer, but will be present solely in the ETL or HTL layer.

The ETL layer shown in FIG. 3 is 20 nm thick. Other thicknesses may be used such as 5 or 10 to 100 nm. Materials other than PBD may be used and are known in the art, such as Alq$_3$, a carbazole, an oxadiazole, a triazole, a thiopene, or oligothiophene group (see also U.S. Pat. No. 6,023,073, issued Feb. 8, 2001, incorporated by reference herein). An OPV of Formula (I) may also be used in the ETL layer.

An electron transport cathode layer may also be included. Materials that maybe used as the electron transport cathode layer include Mg—Ag, Li—Al or Ca, or a non-metallic material such as ITO, and other materials known in the art. It typically has a thickness of about 5 to 30 nm.

Generally, any material that meets the necessary requirements (such as oxidation potential, charge mobility, HOMO, and LUMO positions) may be used as HTL and ETL layers, as well as for the anode and/or cathode.

LiF can be added between the cathode and the ETL in order to enhance the electron injection efficiency, in a thickness of, for example, 0.1 to 2.0 nm.

A capping layer 41 may optionally be used for encapsulation to prevent oxygen and moisture from contaminating the device. The capping layer may be glass, metal, polymer/metal multilayers, or any other suitable material. A patterned insulating layer 47 is used to define the emissive area or pixel size of an OLED; such materials are known in the art and include $SiO_2$, $SiN_x$, and $Al_2O_3$, or substantially any other material that may be used as the insulating material of an OLED, which may be deposited by a variety of processes such as plasma enhanced chemical vapour deposition (PECVD), electron beam, or the like.

The electroluminescent (OPV) materials of this invention may be present alone in an EML which also functions as an HTL and ETL layer, sandwiched between an anode and a cathode. Alternatively, they may be present as part of a heterostructure comprising HTL and ETL layer, in which the electroluminscent material is incorporated into one of the HTL and ETL layers, or as part of a structure having an HTL, EML, and ETL layer.

Figure 5:
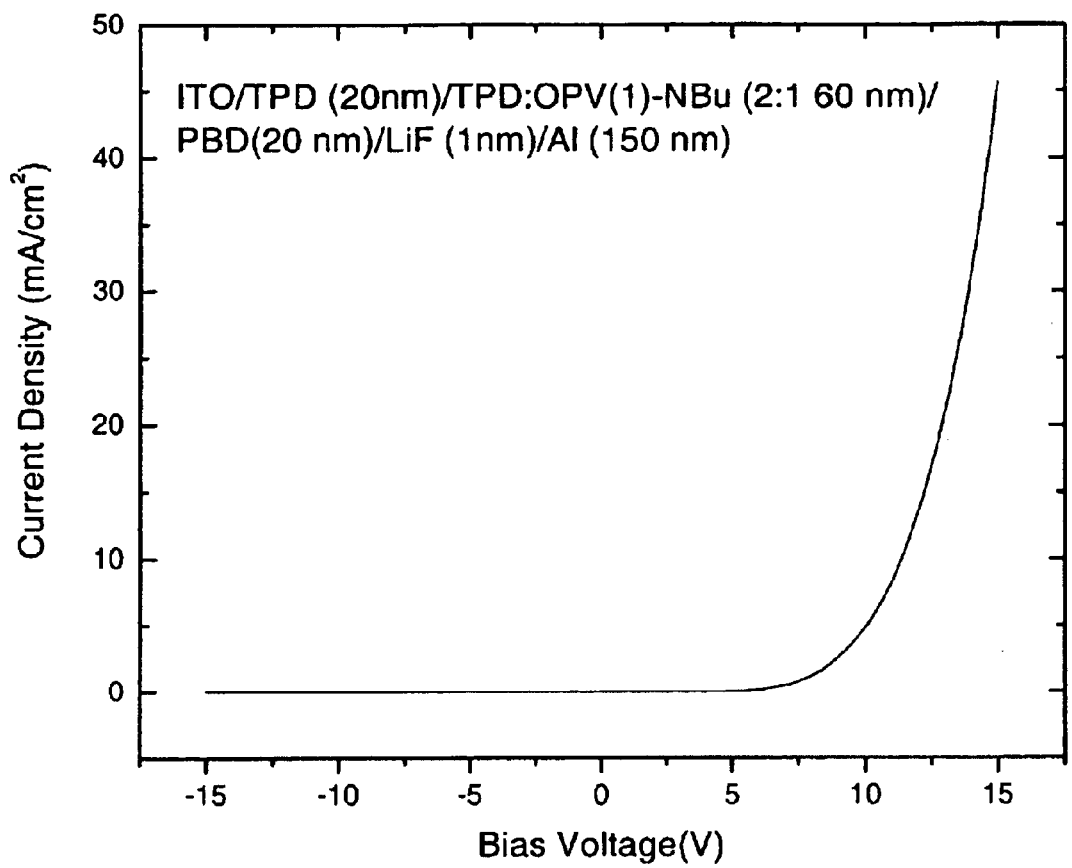
FIG. 5 illustrates a typical current density-voltage curve of an OPV-based organic light-emitting device.

FIG. 5 shows the current density-voltage characteristics of an OLED having a structure as shown in FIG. 3, and using the OPV, OPV(1)-Nbu, as the EML. It shows typical rectifying behavior with a rectifying ratio of $10^5$ at ±15 V.

Figure 6:
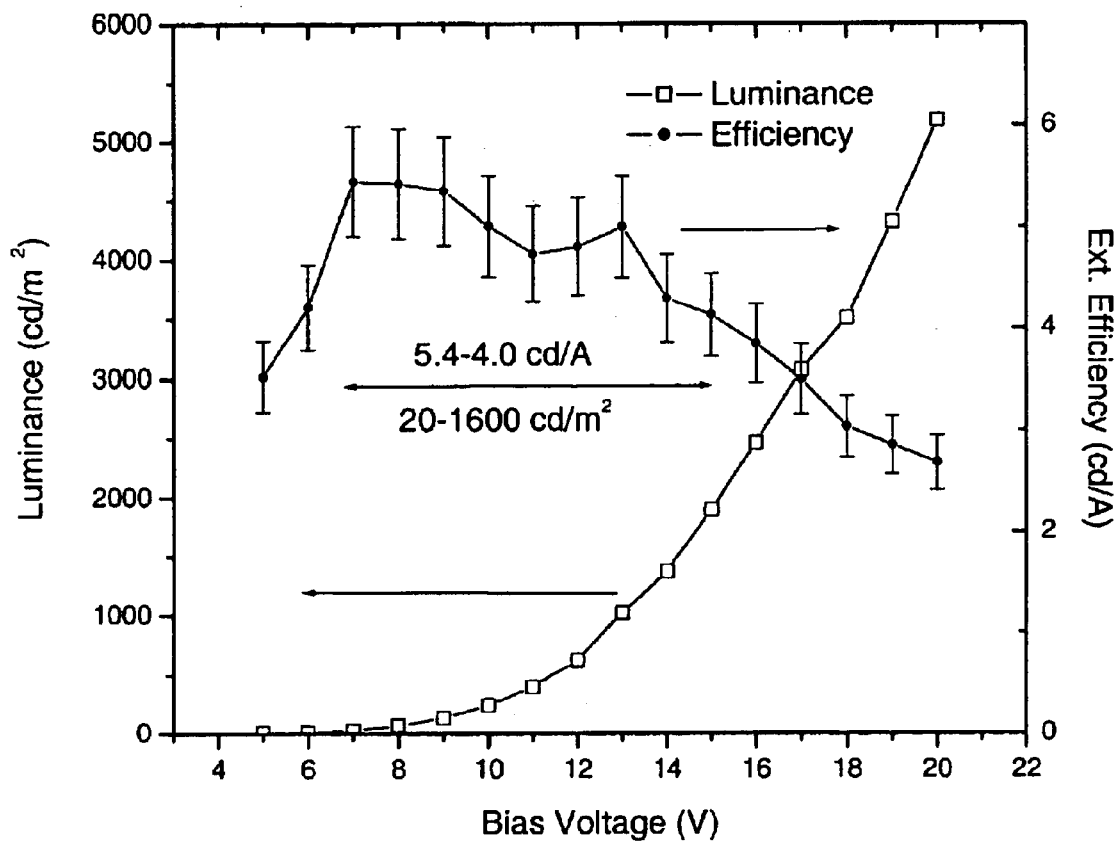
FIG. 6 illustrates the luminance-voltage characteristics of an organic light-emitting device based on OPV.
Figure 7:
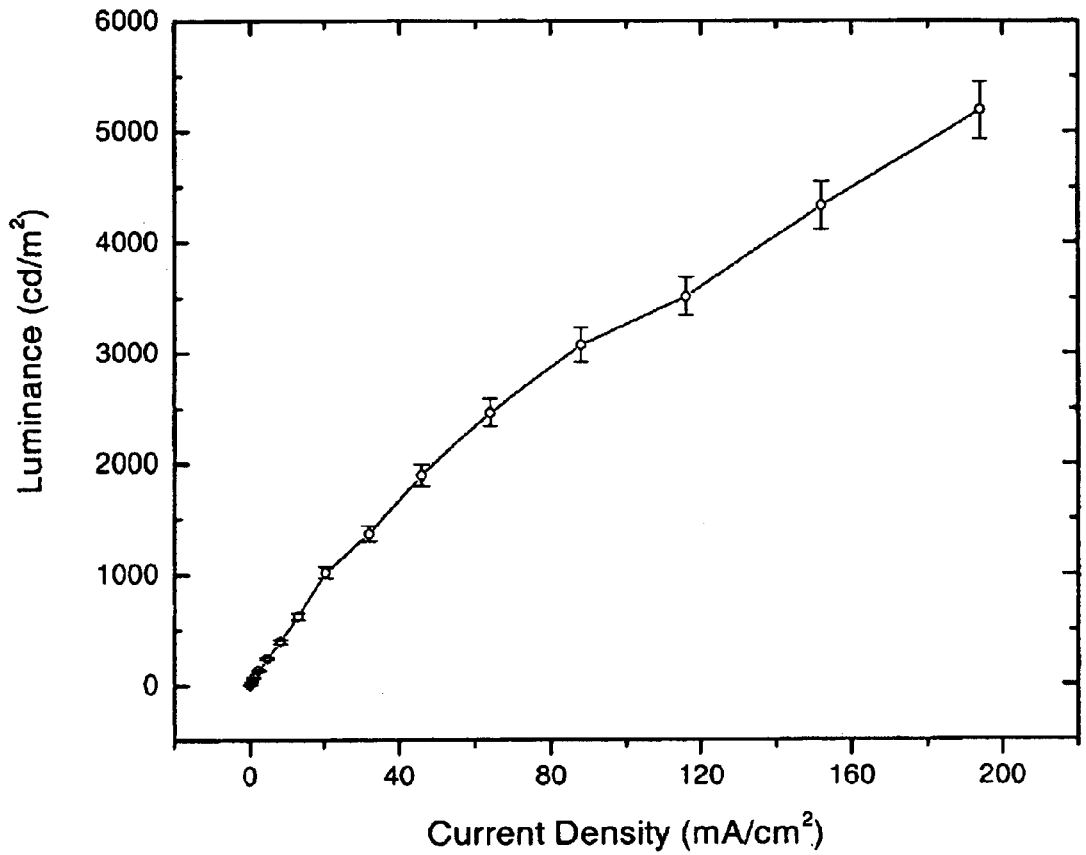
FIG. 7 illustrates the luminance-current density characteristics of an organic light-emitting device based on OPV.

The luminance-voltage and luminance-current density characteristics of the test device of FIG. 3 comprising OPV(1)-NBu as the OPV are shown in FIGS. 6 and 7, respectively. The luminance-current density relationship is not exactly linear, but may be improved, however, by adjusting the layer thickness to realize balanced charge injection. The dependence of the device's external efficiency on bias voltage is also shown in FIG. 6. In the luminance range of 20 to 1600 cd/m², the efficiency varies between 5.4 to 4.0 cd/A. In the luminance range typically used for display 100 to 200 cd/m², the efficiency varies between 5.3 and 5.0 cd/A. The external efficiency may be further improved by optimizing the layer thickness and co-deposition ratio.

The OLEDs of the present invention have the advantage that they can be fabricated entirely from vacuum-deposited molecular organic materials as distinct, for example, from OLEDs in which some of the layers are comprised of polymeric materials, which cannot be readily deposited using vacuum deposition techniques. A vacuum-deposited material is one which can be deposited in a vacuum typically having a background pressure less than one atmosphere, preferably about $10^{-5}$ to about $10^{-11}$ torr for vacuum deposition, or about 50 torr to about $10^{-5}$ torr for vapour deposition.

The OLED of the present invention may be used in substantially any type of device which is comprised of an OLED, for example, in OLEDs that are incorporated into a larger display, a vehicle, a computer, a television, a printer, a large area wall, theater or stadium screen, a billboard or a sign Numerous modifications may be made without departing from the spirit and scope of the invention as defined in the appended claims.

What is claimed is:

1. A light-emitting device comprising:
    an anode; a cathode; and
    a first layer between the anode and cathode, comprising an oligo(phenylenevinylene) (OPV) of the Formula (I):

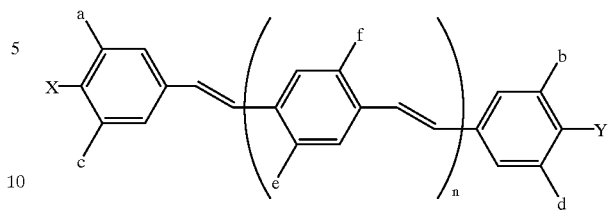

wherein

X is selected from $NH(C_{3-8}$-alkyl) or $N(C_{3-8}$-alkyl$)_2$;

a and c are independently selected from H, $NH(C_{3-8}$-alkyl) or $N(C_{3-8}$-alkyl$)_2$;

Y, b, and d are independently selected from H, $NH(C_{3-8}$-alkyl) or $N(C_{3-8}$-alkyl$)_2$; and e and f are each independently selected from the group consisting of H, $Si(C_{3-8}$-alkyl$)_3$, and $C_{6-14}$-aryl groups.

2. The device of claim 1, wherein the OPV is 1,4-bis-4-(dibutylamine)styrylbenzene.

3. The device of claim 1, further comprising a second layer, the second layer being either a hole transport layer coupled to the anode, or an electron transport layer coupled to the cathode.

4. The device of claim 3, further comprising a third layer, wherein the second layer is a hole transport layer coupled to the anode, and the third layer is an electron transport layer coupled to the cathode.

5. The device of claim 4, wherein the hole transport layer comprises the OPV of Formula (I).

6. The device of claim 4, wherein the electron transport layer comprises the OPV of Formula (I).

7. The device of claim 4, wherein the first layer is an emissive layer, the emissive layer comprising the OPV of Formula (I).

8. The device of claim 7, wherein the emissive layer further includes N,N'-diphenyl-N,N'-bis(3-methylphenyl)-1,1'-biphenyl-4,4'-diamine (TPD).

9. The device of claim 7, wherein the electron transport layer comprises 2-(4-biphenylyl)-5-(4-tert-butylphenyl)-1,3,4-oxadiazole (PBD) and the hole transport layer comprises N,N'-diphenyl-N,N'-bis(3-methylphenyl)-1,1'-biphenyl-4,4'-diamine (TPD).

10. A display including a light-emitting device in accordance with claim 1.

11. The device of claim 1, wherein n is 1.

12. The device of claim 1, wherein e and f are H.

13. The device of claim 1, wherein n is 1;

Y is independently selected from $NH(C_{3-8}$-alkyl) or $N(C_{3-8}$-alkyl$)_2$; and a, b, c, d, e, and f, are H.

14. The device of claim 1, wherein X and Y are each $N(butyl)_2$.

15. The device of claim 14, wherein e and f are each $C_6$-aryl.

16. The device of claim 15, wherein a, b, c, and d are each H.

17. A method of making a light-emitting device, the method comprising the steps of:

preparing an oligo(phenylenevinylene) of the Formula (I):

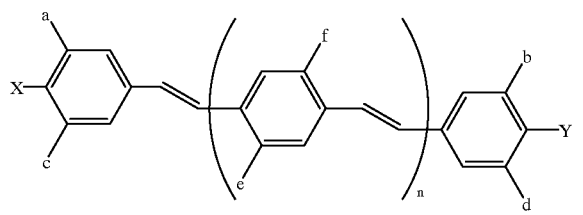

(I)

wherein n is 0 to 3;

X is selected from $NH(C_{3-8}$-alkyl) or $N(C_{3-8}$-alkyl$)_2$;

a and c are independently selected from H, $NH(C_{3-8}$-alkyl) or $N(C_{3-8}$-alkyl$)_2$;

Y, b, and d are independently selected from H, $NH(C_{3-8}$-alkyl) or $N(C_{3-8}$-alkyl$)_2$;

e and f are each independently selected from the group consisting of H, $Si(C_{3-8}$-alkyl$)_3$, and $C_{6-14}$-aryl groups; and layering the oligo(phenylenevinylene) of the Formula (I) between an anode and a cathode to form a light-emitting device.

18. The method of claim 17, wherein the OPV is 1,4-bis-4-(dibutylamine)styrylbenzene.

19. The method of claim 17, further comprising:

selecting n, X, Y, a, b, c, d, e, and f of the OPV of Formula (I) to selectively tune the emissive wavelength of the OPV to a desired wavelength.

20. The method of claim 17, wherein n is 1.

21. The method of claim 20, wherein e and f are H.

22. The method of claim 17, wherein n is 1;

Y is independently selected from $NH(C_{3-8}$-alkyl) or $N(C_{3-8}$-alkyl$)_2$; and a, b, c, d, e, and f, are H.

23. The method of claim 17, wherein X and Y are each $N(butyl)_2$.

24. The method of claim 23, wherein a, b, c, d, e, and f are H.

25. The method of claim 23, wherein e and f are each $C_6$-aryl.

26. The method of claim 25, wherein a, b, c and d are H.

* * * * *